(12) United States Patent
Kuo et al.

(10) Patent No.: US 7,113,403 B2
(45) Date of Patent: Sep. 26, 2006

(54) CENTRIFUGAL FAN TYPE COOLING MODULE

(75) Inventors: Wei-Chen Kuo, Taipei (TW);
Chung-Shu Wang, Taipei (TW);
Shou-Te Yu, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 57 days.

(21) Appl. No.: 10/819,217

(22) Filed: Apr. 7, 2004

(65) Prior Publication Data

US 2005/0225941 A1    Oct. 13, 2005

(51) Int. Cl.
*H05K 7/20* (2006.01)
*H01L 23/34* (2006.01)
*H01L 23/467* (2006.01)
*F28F 7/00* (2006.01)

(52) U.S. Cl. .................. 361/697; 361/695; 257/722; 165/80.3; 165/121; 174/16.3

(58) Field of Classification Search ............... 361/697
See application file for complete search history.

(56) References Cited

U.S. PATENT DOCUMENTS

| | | | |
|---|---|---|---|
| 5,979,541 A * | 11/1999 | Saito | 165/80.3 |
| 6,166,904 A * | 12/2000 | Kitahara et al. | 361/697 |
| 6,269,003 B1 * | 7/2001 | Wen-Chen | 361/704 |
| 6,407,919 B1 * | 6/2002 | Chou | 361/697 |
| 6,450,248 B1 * | 9/2002 | Chang | 165/80.3 |
| 6,860,323 B1 * | 3/2005 | Cheng | 165/121 |
| 6,894,896 B1 * | 5/2005 | Liu | 361/697 |

* cited by examiner

*Primary Examiner*—Lisa Lea-Edmonds
*Assistant Examiner*—Zachary Pape

(57) ABSTRACT

A centrifugal fan type cooling module includes a centrifugal fan and a radiator. The centrifugal fan provides a fan rotor with fan blades and an axial shaft and a fan stator set with an axial core, an upper cover and a frame. The fan blades extend straight forward radially with the outer end of each fan blade has an enlarged curve end part and the rest part of the respective fan blade has a width shorter than the axial shaft. The frame encloses and fits with the top of the radiator and the axial shaft is rotationally joined to the axial core such that a hollow space is formed between the radiator and the fan rotor. Heat from an electronic component is transmited to the radiator and removed outward quickly in all directions by way of upward suction force of the centrifugal fan instead of contacting other electronic members directly.

2 Claims, 6 Drawing Sheets

CENTRIFUGAL FAN TYPE COOLING MODULE

BACKGROUND OF THE INVENTION

1. Field of the Invention

The present invention is related to a centrifugal fan type cooing module and particularly to a specific centrifugal fan attached to a radiator with which the air flow with heat is sucked upward and removed toward all directions instead of contacting any other electronic members disposed beside the heat generating electronic component.

2. Brief Description of the Related Art

Due to the electronic component providing faster running speed and micro design of the size thereof, a great deal of heat generated by the running electronic component has become a puzzle subject. If the heat is unable to be removed successfully, it may lead to the electronic component running abnormally and, even more, it may seriously result in the computer being shut down to affect the operation capability thereof. In order to remove the heat effectively, a heat dissipation component such as a radiator or a cooling fan frequently is added to the electronic component to help heat removal.

Referring to FIGS. 1 to 3, a conventional cooling module is composed of a cooling fan 11 and a radiator 12. The cooling fan 11 is an axial flow type fan and mounted to the radiator 12. The radiator 12 is tightly attached to the electronic component 13. Once the cooling fan 11 is powered on, the air flow generated by the cooling fan is blown downward to the radiator 12 and the electronic component 13 to carry the heat generated by the electronic component 13 outward. Part of the heat, which has transmitted to the radiator and is supposed to be removed by the cooling fan, unavoidably accompanies the blown downward air flow to contact with the electronic component 13 arid the moving downward heat is contrary to the principle of the heat being moving toward low temperature from high temperature. As a result, the efficiency of heat dissipation is always low and unable to be promoted effectively.

SUMMARY OF THE INVENTION

The crux of the present invention resides in that a centrifugal fan is utilized to suck the heat upward to comply with the principle of heat moving toward low temperature from high temperature such that the heat on the electronic component and the heat has been transmitted to the radiator can be removed quickly to avoid the electronic component being overheated and to enhance the operation capability of the electronic component effectively.

An object of the present invention is to provide a centrifugal fan type cooling module, which can remove the heat generated from the electronic component quickly.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE PREFERRED EMBODIMENTS

Figure 1:
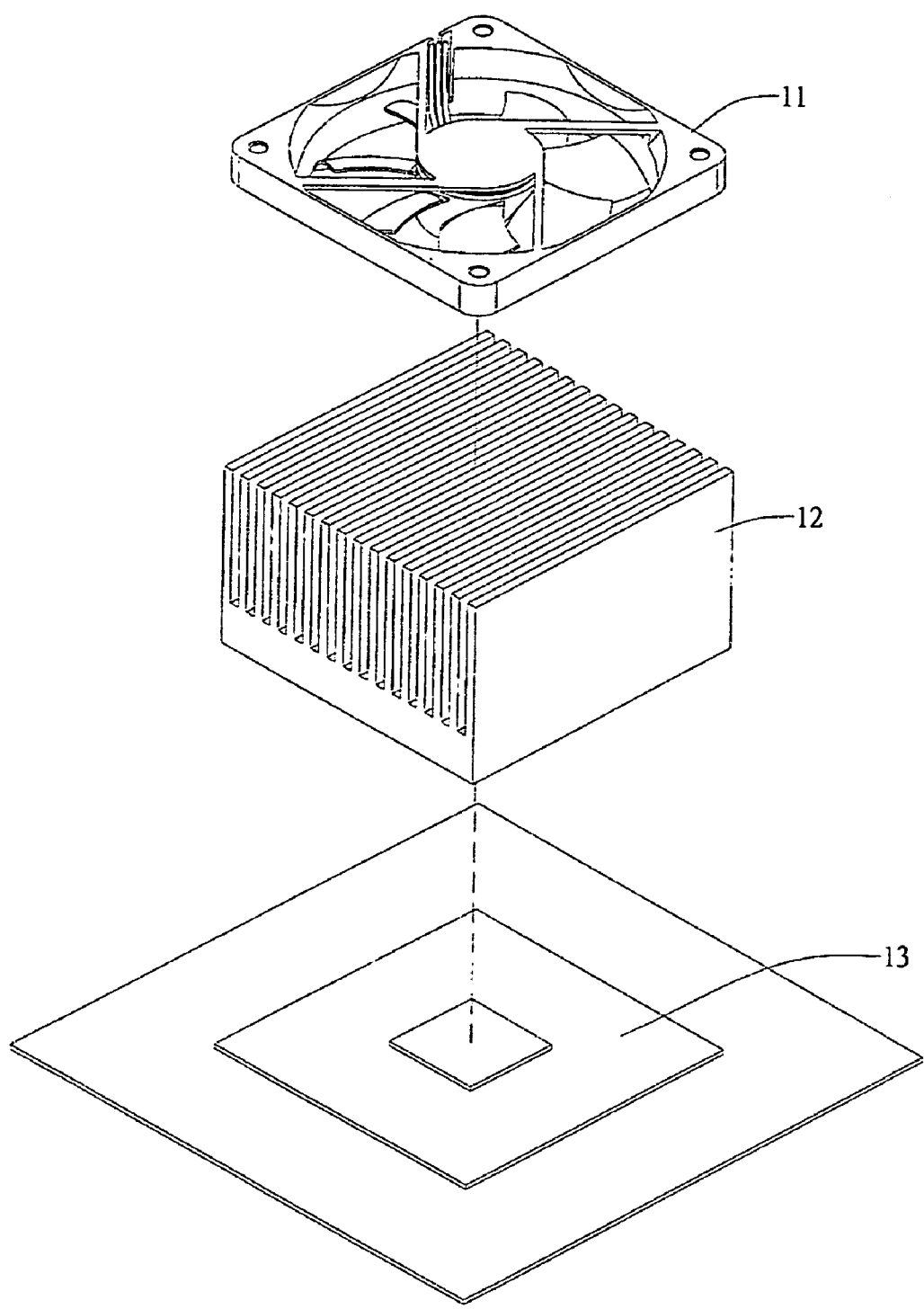
FIG. 1 is an exploded perspective view of a conventional cooling module.
Figure 2:
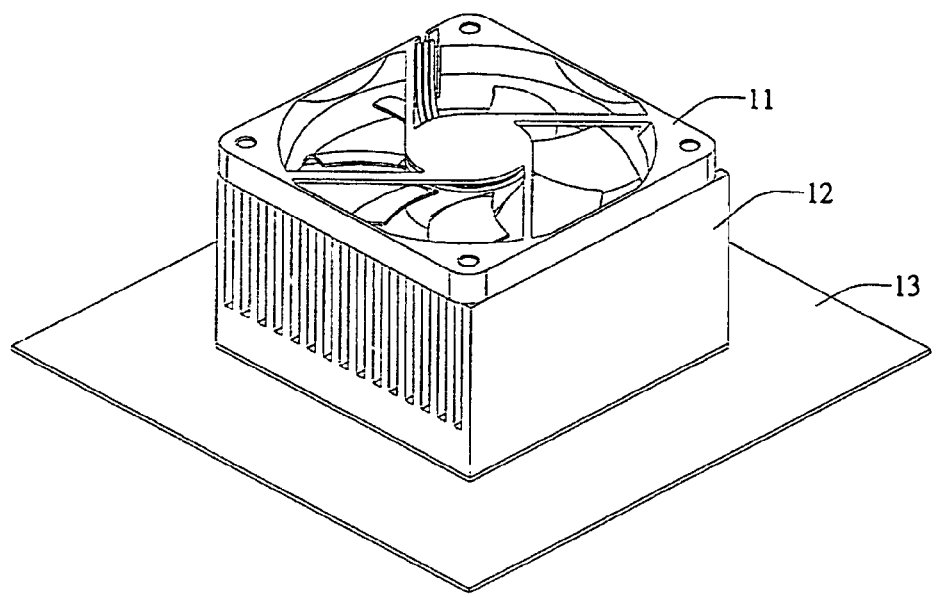
FIG. 2 is an assembled perspective view of the conventional cooling module shown in FIG. 1.
Figure 3:
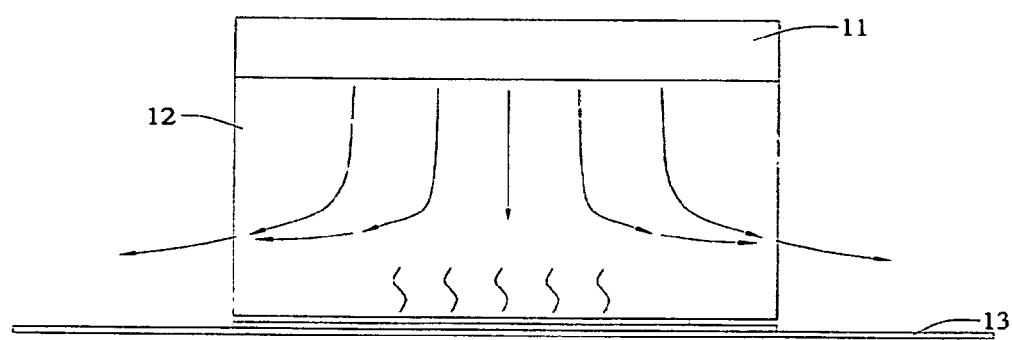
FIG. 3 is a plan view illustrating air flow in the conventional cooling module.
Figure 4:
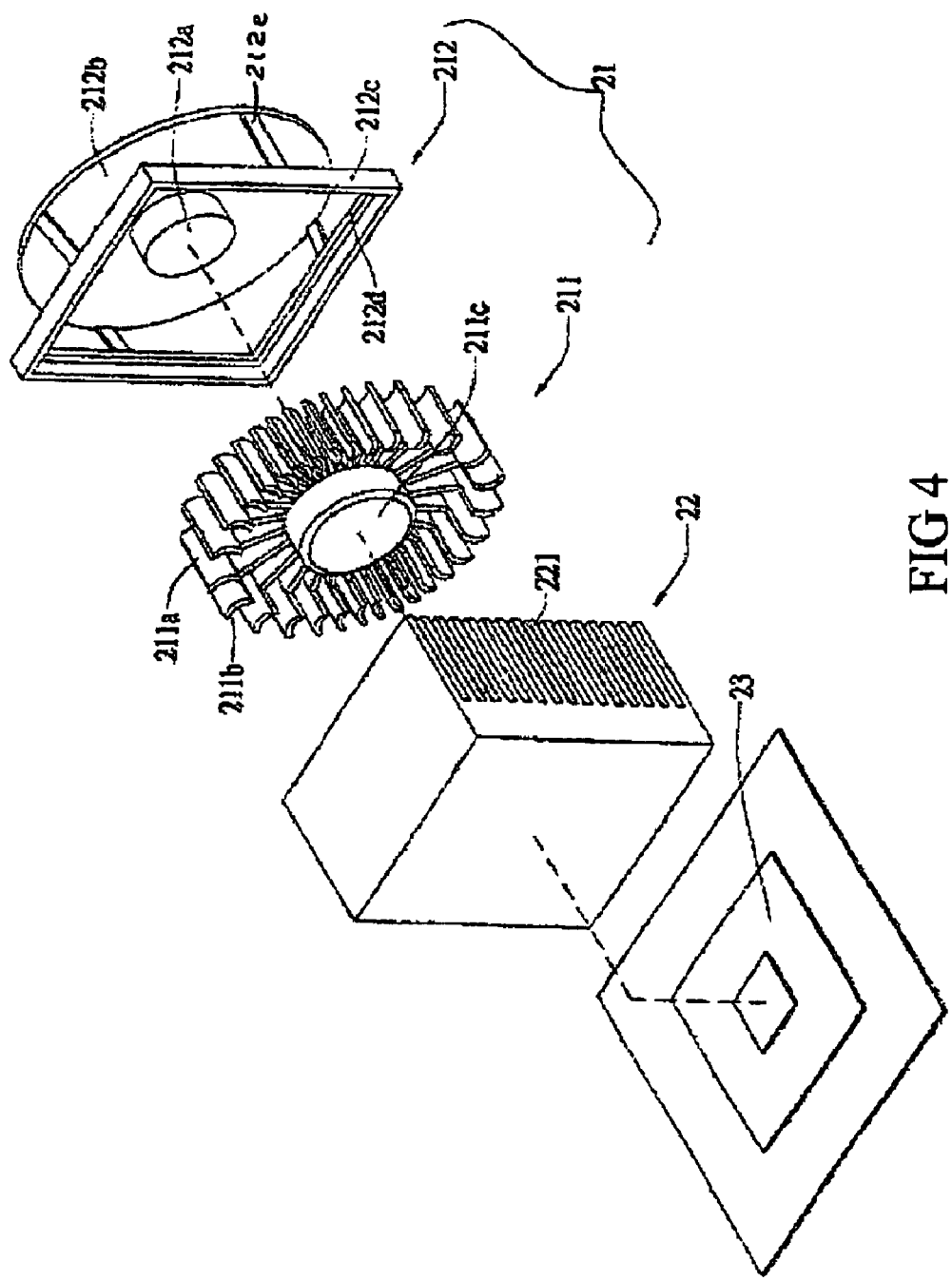
FIG. 4 is an exploded perspective view of the first embodiment of the centrifugal type cooling module according to the present invention.
Figure 5:
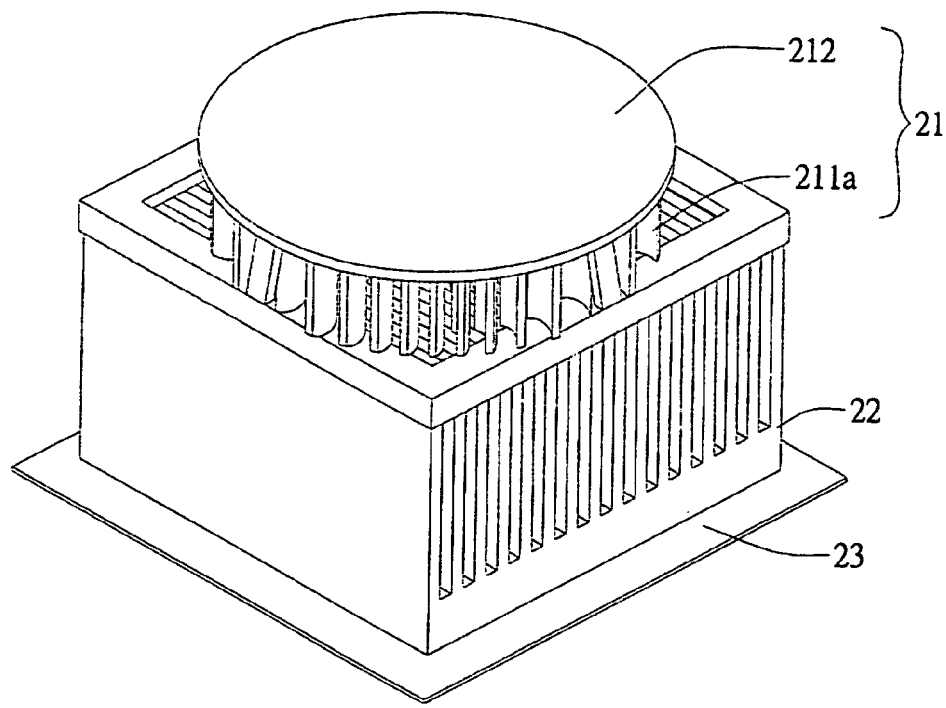
FIG. 5 is an assembled perspective view of the first embodiment shown in FIG. 4.

Referring to FIGS. 4 and 5, a centrifugal fan type cooling module according to the present invention in the first embodiment thereof includes a centrifugal fan 21 and a radiator 22. The centrifugal fan 21 further includes a fan rotor 211 which provides an axial shaft 211c and a plurality of L shaped fan blades 211a, and a fan stator set 212, which further provides an axial core 212a, an upper cover 212b and a frame 212c. The fan blades 211a extend outward radially from the axial shaft 211c straightforward with each fan blade 211a having an enlarged curve end part respectively. The frame 212c has a flange 212d disposed at the uppermost inner side thereof for being mounted to the radiator 22. It is illustrated in the first embodiment that the frame 212c is provided with a shape of square corresponding to the radiator 22. A plurality of connecting bars 212e extend upward from four edges of the frame 212c to be fixedly joined to the upper cover 212b. The axial core 212a is disposed at the bottom side of the upper cover 212b corresponding to the axial shaft 211c.

The axial shaft 211c of the fan rotor 211 is rotationally attached to the axial core 212a of the fan stator set 212. The radiator 22 is provided with cooling fins 221 with the top thereof fitting with the frame 212c of the fan stator 212 against the flangees 212d.

Then, the bottom of the radiator 22 is tightly attached to the electronic component 23.

Figure 6:
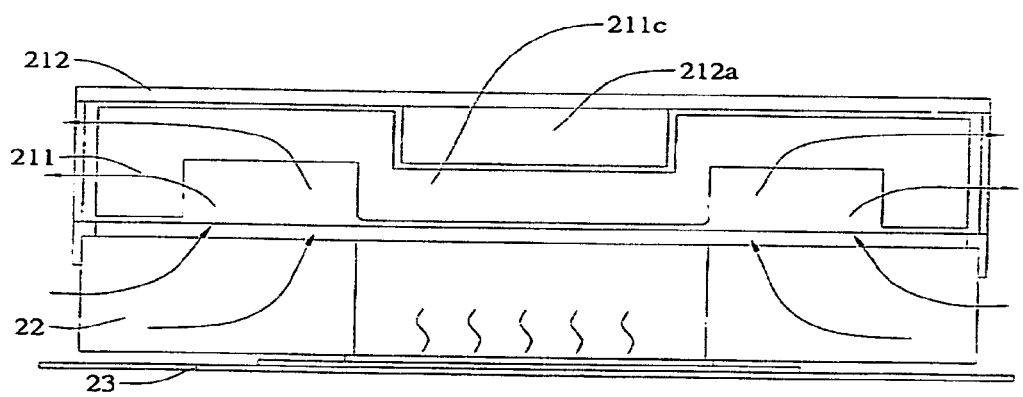
FIG. 6 is a plan view illustrating air flow in the cooling module of the first embodiment.

Referring to FIG. 6 in company with FIG. 4 again, because the L-shaped fan blades 211a each are arranged to have an L-shaped recess between the fan blades 211e and the axial shaft 211e to face the radiator such that a circular hollow space is formed between the radiator 22 and fan blades 211a after the frame 212c fitting with the top of the radiator 22. Once the fan rotor 211 rotates, stagnating air generated under the axial shaft 211c can move outward the centrifugal fan via the hollow space for enhancing the effect of heat dissipation.

Referring to FIG. 6, it can be seen how the air flow in the radiator of the present invention removes the heat generated by the electronic component 23. The heat is transmitted to the radiator 22 and moves outward via the cooling fins 221 by way of heat exchange. When the centrifugal fan is power onto rotate the fan rotor 211, a suction force is created to drag the air flow upward such that it is capable of accelerating the heat in the radiator moving out according to the principle of heat moving toward lower temperature area. Further, the heat is removed out in all directions by the centrifugal fan instead of being blown toward other electronic members near the electronic component 23. In this way, the effect of heat dissipation can be enhanced substantially.

Figure 7:
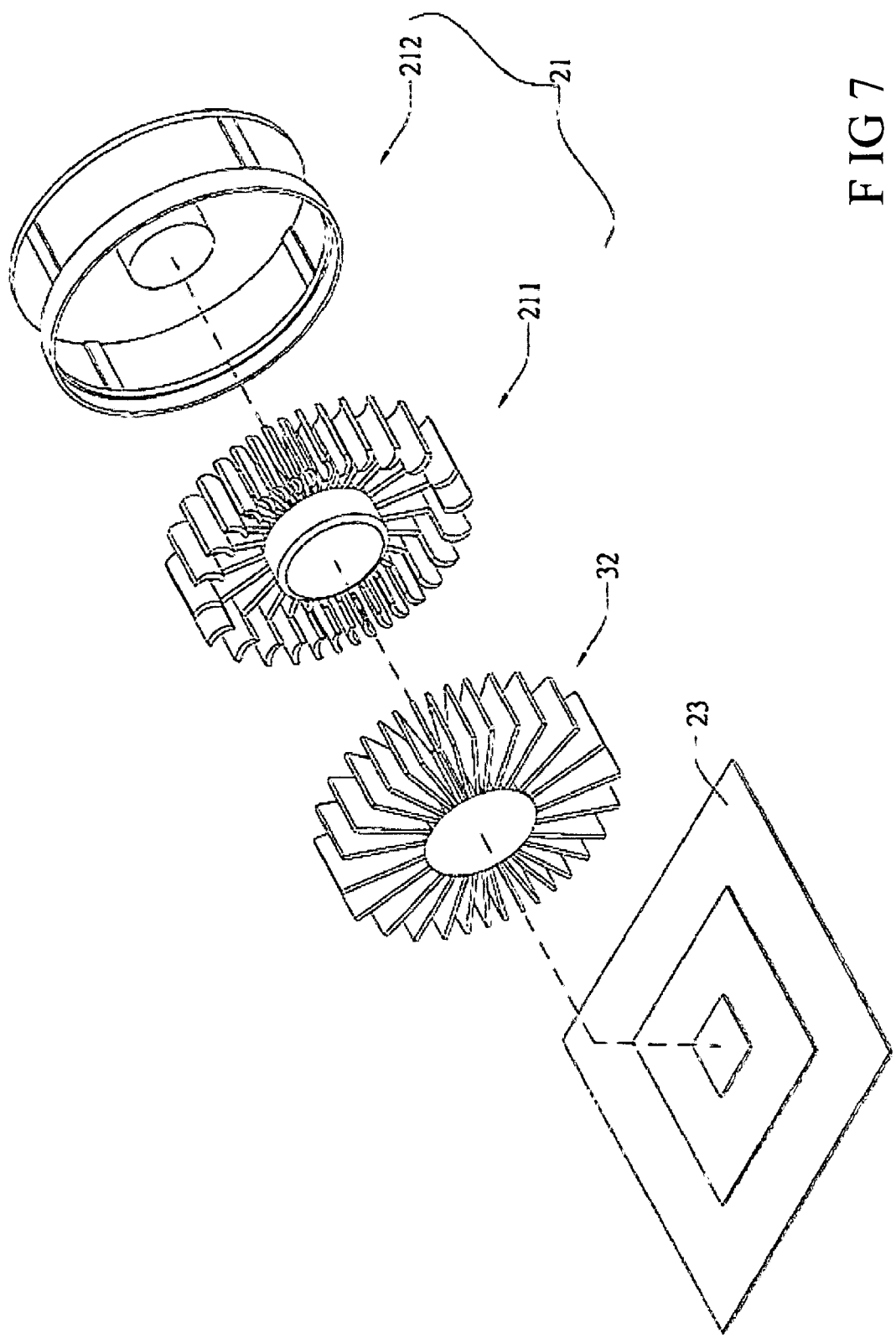
FIG. 7 is an exploded perspective view of the cooling module according to the present invention in the second embodiment thereof.
Figure 8:
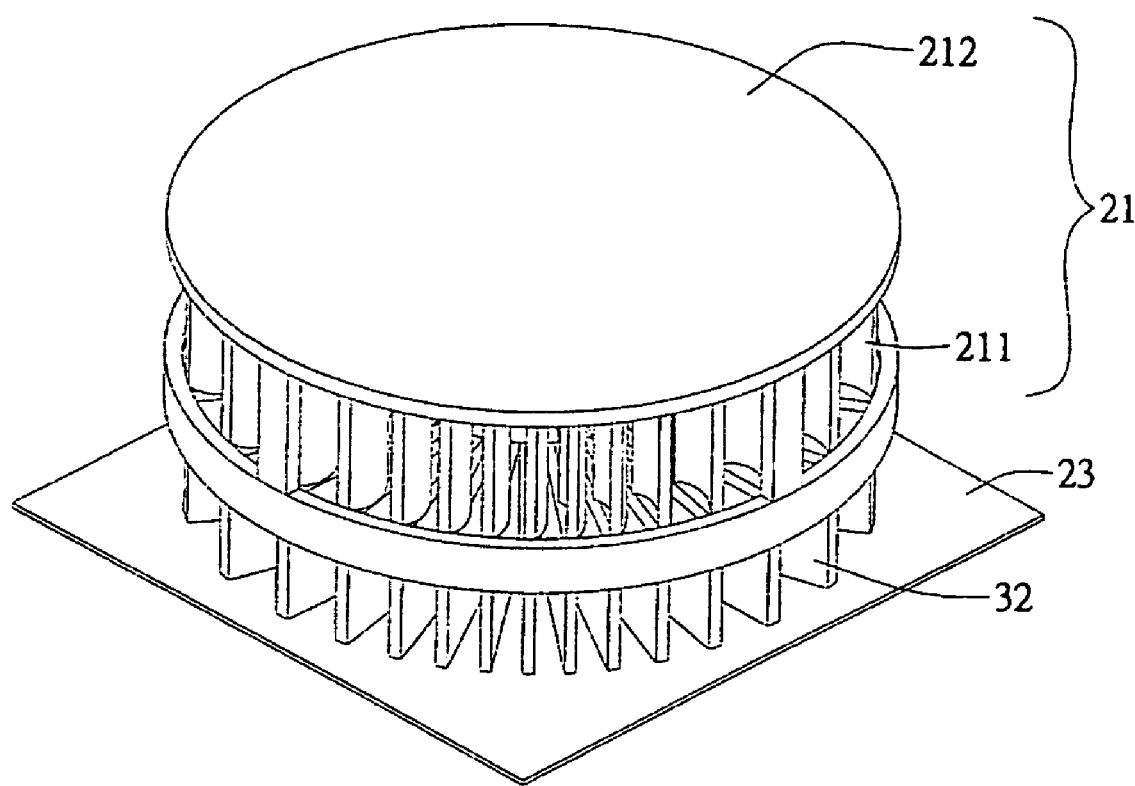
FIG. 8 is an assembled perspective view of the second embodiment shown in FIG. 4.

Referring to FIGS. 7 and 8, the second embodiment of the present invention is illustrated. The entire structure of the second embodiment is almost the same as the first embodiment of the present invention and provides centrifugal fan 21 with a fan rotor 211 and a fan stator set 212 and a radiator 32. The electronic component 23 is tightly attached to the radiator 32. The only difference is that the radiator 32 and the frame of the fan stator set 212 have a circular shape instead of square shape.

What is claimed is:

1. A centrifugal fan type cooling module, comprising:
    a centrifugal fan; and
    a radiator, being joined to the centrifugal fan at the top thereof and being attached to an electronic component tightly at the bottom thereof;
    wherein, the centrifugal fan further comprises
    a fan rotor, having an axial shaft and a plurality of L-shaped fan blades extending straightforward radially from the axial shaft with the outer end of each of the fan blades having an enlarged curve end part such that a recess is formed between the respective fan blade and the axial shaft so as to constitute a circular hollow space between the radiator and the fan rotor; and
    a fan stator set, having a frame, an upper cover and an axial core with a flange surrounding the uppermost inner side of the frame, a plurality of connecting bars extending upward from the frame to be fixedly joined to the circumference of the upper cover and the axial core being disposed at the bottom side of the upper cover corresponding to the axial shaft such that the axial shaft is rotationally attached to the axial core and the frame encloses and fits with the upper side of the radiator against the flange;
    whereby, once the frame is mounted to the radiator, the fan rotor is disposed between the upper cover and the frame and a hollow space is formed between the radiator and the fan blades such that heat from the electronic component is capable of transmitting to the radiator and being dragged upward via the hollow space before moving outward around the centrifugal fan while the centrifugal fan is running.

2. The centrifugal fan type cooling module as defined in claim 1, wherein the frame has a shape corresponding to the radiator.

* * * * *